United States Patent [19]

Winnerl et al.

[11] Patent Number: 4,873,668
[45] Date of Patent: Oct. 10, 1989

[54] INTEGRATED CIRCUIT IN COMPLEMENTARY CIRCUIT TECHNOLOGY COMPRISING A SUBSTRATE BIAS GENERATOR

[75] Inventors: Josef Winnerl, Landshut; Dezsö Takacs, Munich, both of Fed. Rep. of Germany

[73] Assignee: Siemens Aktiengesellschaft, Berlin and Munich, Fed. Rep. of Germany

[21] Appl. No.: 86,295

[22] Filed: Aug. 17, 1987

[30] Foreign Application Priority Data

Sep. 30, 1986 [DE] Fed. Rep. of Germany ....... 3633301

[51] Int. Cl.$^4$ .................... G11C 7/00; G11C 11/40
[52] U.S. Cl. ................. 365/189.09; 365/226; 365/190; 307/296.1
[58] Field of Search ............... 307/291, 592, 304, 297, 307/296.1; 365/189, 190, 226, 174, 181

[56] References Cited

U.S. PATENT DOCUMENTS

| 4,438,346 | 3/1984 | Chuang et al. | 307/304 X |
| 4,460,835 | 7/1984 | Masuoka | 307/291 X |
| 4,670,668 | 6/1987 | Liu | 307/592 X |
| 4,670,669 | 6/1987 | Cottrell et al. | 307/303.2 |

Primary Examiner—Stuart N. Hecker
Assistant Examiner—Alyssa H. Bowler
Attorney, Agent, or Firm—Hill, Van Santen, Steadman & Simpson

[57] ABSTRACT

An integrated circuit executed in complementary circuit technology, has a substrate bias generator (16) which connects the substrate (1) to a substrate bias. A well (2) of opposite conductivity is inserted into the substrate (1), and FETs with complementary channels are inserted into the substrate (1) and into the well (2), respectively. The source regions (3) of the FET's of first conductivity lie at ground potential. In order to avoid latch-up effects, the output (17) of the substrate bias generator (16) is connected via an electronic switch (S1) to a circuit point (8) lying at ground potential, the switch being driven via a time-delay circuit (24) charged with the supply voltage so that it opens with a prescribed time-delay after the supply voltage is applied.

7 Claims, 1 Drawing Sheet

INTEGRATED CIRCUIT IN COMPLEMENTARY CIRCUIT TECHNOLOGY COMPRISING A SUBSTRATE BIAS GENERATOR

BACKGROUND OF THE INVENTION

The invention is directed to an integrated circuit in complementary circuit technology having a substrate bias generator.

In circuits of this type, the semiconductor substrate does not lie at the ground potential $V_{SS}$ of the circuit but at a substrate bias $V_{BB}$ which is generated by the substrate bias generator. Given a semiconductor substrate of p-conductive material having an inserted, n-conductive well-shaped semiconductor zone, a negative substrate bias of about $-2$ through $-3$ volts is used. The source regions of field effect transistors, which are provided outside of the well-shaped semiconductor zone on the semiconductor substrate, are connected to the ground potential $V_{SS}$.

At the moment the positive supply voltage $V_{DD}$ is switched on, the p-conductive semiconductor substrate is initially "floating", i.e., it is disconnected from external potentials. The depletion layer capacitances which are present, first, between the well-shaped semiconductor zone and the substrate and, second, between the source regions connected to the grounded potential and the substrate, can thereby be temporarily charged to a positive bias, which persists until the substrate bias generator takes effect and is replaced as the negative substrate bias gradually builds up. Positive biases, however, represent a high safety risk for the integrated circuit since a latch-up effect can be triggered which generally means the destruction of the integrated circuit.

For an understanding of the latch-up effect, one can assume that four successive semiconductor layers alternating in conductivity type are generally present between a terminal of a field effect transistor of the first channel type lying in the well-shaped semiconductor zone and a terminal of a field effect transistor of the second channel type placed outside of this zone on the semiconductor substrate, whereby the one terminal region of the former transistor is formed by the first semiconductor layer, the well-shaped semiconductor zone is formed by the second layer, the semiconductor substrate is formed by the third layer, and the one terminal region of the latter transistor is formed by the fourth semiconductor layer. Given a positive bias of the semiconductor substrate, the p-n junction between the third and the fourth semiconductor layers can be forward biased to such a degree that a current path arises between the transistor terminals, attributable to a parasitic thyristor effect within this four-layer structure. The current path also remains after a dismantling of the positive substrate bias and can thermally overload the integrated circuit.

SUMMARY OF THE INVENTION

The object of the invention is to specify a circuit of the above species wherein the occurence of latch-up effects is largely avoided. This is achieved in the present invention by a circuit incorporating a switch connected between the output of the bias generator and ground, and controlled by the supply voltage through a delay device.

The advantage obtainable with the invention is particularly that simple means can be utilized to prevent the semiconductor substrate from being charged with a bias of an undesired polarity when the supply voltage is switched on, this bias potentially triggering a latch-up effect.

Other objects and advantages will become clear on review of the following description and the accompanying drawings.

SUMMARY OF THE DRAWINGS

The invention shall be set forth in greater detail below with reference to a preferred exemplary embodiment shown in the drawings, in which.

PREFERRED EMBODIMENT

Figure 1:
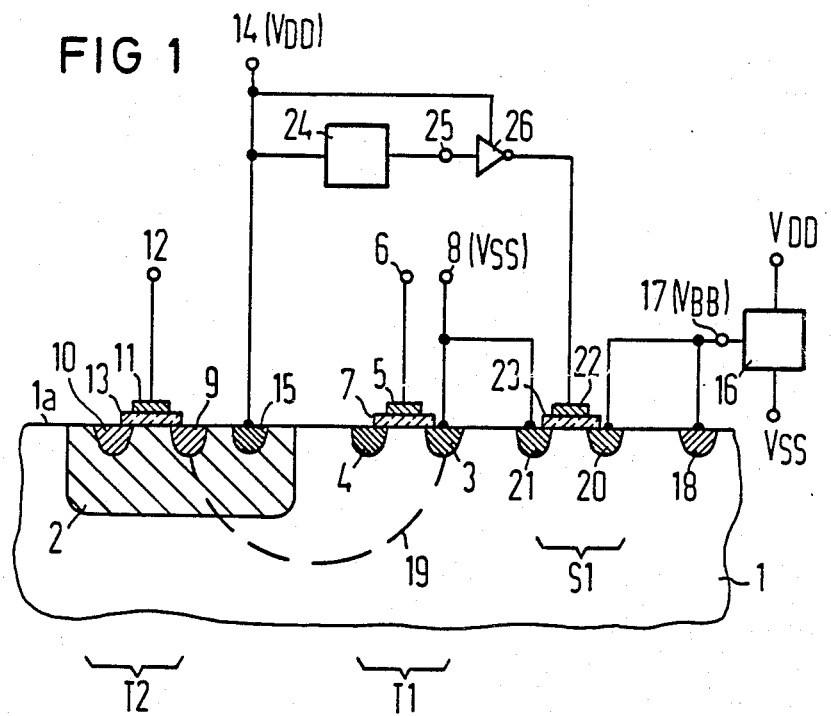
FIG. 1 illustrates a preferred exemplary embodiment of the invention in a partially schematic illustration.

FIG. 1 shows an integrated circuit of the invention which is constructed on a semiconductor substrate 1 of doped semiconductor material, for example p-conductive silicon. The substrate 1 has an n-conductive, well-shaped semiconductor zone 2 which extends up to the boundary surface 1a of the substrate 1. Outside of the semiconductor zone 2, $n^+$-doped semiconductor regions 3 and 4 are inserted into the substrate 1, these forming the source and drain regions of an n-channel field effect transistor T1. The channel region lying between regions 3 and 4 is covered by a gate 5 which is provided with a terminal 6 and which is separated from the boundary surface 1a by a thin, electrically insulating layer 7 of, for example, $SiO_2$. The source region 3 is connected to a terminal 8 which lies at a ground potential $V_{SS}$. Further, $p^+$-doped regions 9 and 10 are inserted into the semiconductor zone 2, these representing the source region and the drain region of a p-channel field effect transistor T2. The channel region lying between the regions 9 and 10 is covered by a gate 11 which is provided with a terminal 12 and which is separated from the boundary surface 1a by a thin, electrically insulating layer 13 of, for example, $SiO_2$. The source region 9 of T2 is connected via regions 2 and 15 to a terminal 14 which is wired to a supply potential $V_{DD}$. The semiconductor zone 2 lies at the supply voltage $V_{DD}$ via the $n^+$-doped contact region 15 which is in communication with the terminal 14.

A substrate bias generator 16 is also provided, this generating a negative substrate bias of, for example, $-2$ through $-3$ volts. The output 17 of the substrate bias generator is connected to a $p^+$-doped contact region 18 which is inserted into the semiconductor substrate 1. The semiconductor substrate 1 is thus held at the negative substrate bias generated by 16, whereas the source regions, for example 3, of the transistors, for example T1, situated in the semiconductor substrate 1 are connected to ground potential $V_{SS}$. What is achieved, among other things, is that the depletion layer capacitances of the source regions of the transistors arranged in the substrate 1 are diminished.

In order to avoid a latch-up effect which could occur within the four-layer structure 3, 1, 2 and 9 lying along the broken line 19 between the terminals 8 and 14, the output 17 of the substrate bias generator 16 is connected to a circuit point situated at ground potential, being connected thereto via an electronic switch S1. In the illustrated exemplary embodiment, this circuit point is the terminal 8. In detail, the output 17 in the arrangement of FIG. 1 is connected to an n+-doped semiconductor region 20 which is inserted into the semiconductor substrate 1. A further n+-doped semiconductor region 21 inserted into the semiconductor substrate 1 is connected to the circuit point, i.e., to the terminal 8, lying at ground potential. The region of the semiconductor substrate 1 lying between the regions 20 and 21 is covered by a gate 22 which is separated from the boundary surface 1a by a thin, electrically insulating layer 23 of, for example, $SiO_2$. Together with the parts 22 and 23, the regions 20 and 21 form an n-channel field effect switching transistor which represents the electronic switch S1. The drive of S1 is provided via a time-delay circuit 24 whose input lies at the terminal 14 and whose output 25 is connected to the gate 22 via an inverting amplifier 26. At the time that the supply voltage $V_{DD}$ is applied via the terminal 14 when the circuit is placed in operation, then the inverter 26 connected to 14 at first produces an output level roughly corresponding to $V_{DD}$ and places the switch S1 into its conductive condition, as long as the output 25 of the time delay unit 24 remains at the ground potential $V_{SS}$, which it exhibits in its quiescent condition. Via S1, the output 17 of the substrate bias generator 16 and, thus, the substrate 1 are held at the ground potential $V_{SS}$ of the circuit. Only when the time-delay circuit 24 reacts to the supply voltage $V_{DD}$ applied to the input side, after a prescribed delay time, such that it emits a higher voltage level via its output 25 such that the output of the inverter 26 is switched to a low output voltage, is the switch S1 cut off. The drive of S1 set forth above thus determines that the substrate 1, after the application of the supply voltage, lies at a potential corresponding to the ground potential $V_{SS}$ during a delay time prescribed by the time-delay circuit 24. Only after the expiration of the delay time can the substrate 1 be charged with the bias supplied by the substrate bias generator 16 and supplied via 17 and 18, being charged therewith because the switch S1 is then inhibited. When the duration of the said delay time is dimensioned such that S1 is not cut off until the full, negative bias has built up at the output 17 of 16, the risk of the occurence of a latch-up effect when the supply voltage is connected is eliminated.

Figure 2:
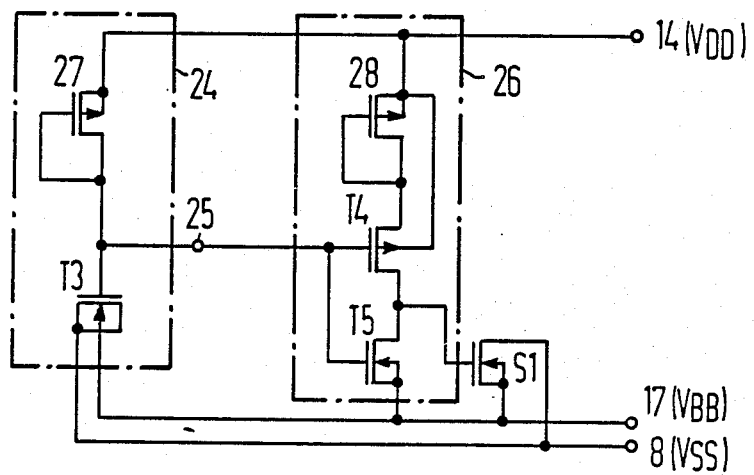
FIG. 2 illustrates an expedient formation of a subcircuit of FIG. 1.

FIG. 2 shows a preferred embodiment of the time-delay circuit 24 and of the inverter 26 of FIG. 1 which can be integrated on the semiconductor substrate 1 in a simple way. An n-channel field effect transistor T3 and a load element 27 are provided, the latter being formed by a p-channel field effect transistor whose gate is connected to its drain terminal. The source terminal of this transistor is conducted to the terminal 14 connected to $V_{DD}$, whereas its drain terminal is connected to the gate of T3. The source and drain terminals of T3 are connected to one another and are connected to the terminal 8 lying at ground potential $V_{SS}$. Together with the load element 27, the transistor T3, acting as a capacitance, forms a RC element which represents an especially simple realization of the time-delay circuit 24. The output 25 of circuit 24 is then applied via the amplifier 26 to the gate of the n-channel field effect transistor forming the switch S1. The amplifier 26, fashioned as an inverter, contains a series circuit of a p-channel field effect transistor T4 and an n-channel field effect transistor T5, whose gates are connected to the output 25 of the time delay unit 24. The upper terminal of T4 is connected to terminal 14 via a load element 28 and the lower terminal T5 is connected to the terminal 17. The load element 28 is expediently realized as a p-channel field effect transistor whose gate is wired to its drain terminal. The electronic switch S1, in accord with FIG. 1, is inserted between the circuit points 17 and 8, and its gate is connected to the junction of T4 and T5. When, after $V_{DD}$ has been connected to the terminal 14, the voltage at 25 has risen to a value which corresponds to the threshold voltage of T5, the gate of S1 is supplied with the voltage $V_{BB}$ via the transistor T5 which is then conductive, so that S1 inhibits, i.e., is cut off.

In a departure from the embodiment set forth above, the electronic switch S1 can also be realized in some other way, for example as a bipolar transistor which may be executed as an external circuit element and wired to the terminals 8 and 17 via connecting lines.

In addition to the embodiments set forth above, the invention also contemplates embodiments wherein n-conductive substrates are provided with p-conductive, well-shaped semiconductor zones. The conductivity types of all semiconductor parts and the polarities of all voltages are thereby replaced by their respectively opposite conductivity types and voltages.

A preferred application of the invention is found in periphery or interface circuits for dynamic semiconductor memories having high packing density which are monolithically integrated with the memory cells.

It will be apparent that various modifications and/or additions may be made in the apparatus of the invention without departing from the essential feature of novelty involved, which are intended to be defined and secured by the appended claims.

We claim:

1. In an integrated circuit executed in complementary circuit technology comprising a pair of field effect transistors (T1, T2) of different channel types, said first field effect transistor (T1) being provided in a doped semiconductor substrate (1) of a first conductivity type and at least one second field effect transistor (T2) being arranged in a well-shaped semiconductor zone (2) of a second conductivity type provided in said semiconductor substrate (1), said semiconductor zone adapted to be wired to a supply voltage ($V_{DD}$), whereby a terminal region (3) of at least one first field effect transistor (T1) is charged with a grounded potential (VSS), the semiconductor substrate adapted to be connected to the output (17) of a substrate bias generator (16) to which the grounded potential and the supply voltage are supplied and which biases the p-n junction between the terminal region (3) of the first field effect transistor lying at ground potential and the semiconductor substrate (1) in non-conducting direction, the combination comprising;

an electronic switch for connecting the output (17) of the substrate bias generator (16) to ground potential for a predetermined time after said supply voltage ($V_{DD}$) is applied; and a time delay circuit connected between said electronic switch and said supply voltage ($V_{DD}$) for opening said switch in response to said supply voltage after said predetermined time.

2. The integrated circuit according to claim 1, wherein said substrate bias generator (16) is integrated with said field effect transistor on the same semiconductor substrate (1).

3. The integrated circuit according to claim 1 or 2, including means for connecting the output (17) of said substrate bias generator (16) to a first semiconductor region (20) of the second conductivity type inserted into the semiconductor substrate; a second semiconductor region (21) of the second conductivity type inserted into the semiconductor substrate and connected to ground potential; and a region of the semiconductor substrate (1) lying between these two semiconductor regions (20, 21) being covered by a gate (22) separated from the boundary surface (1a) of the semiconductor substrate by a thin, electrically insulating layer (23), whereby said gate, together with the two semiconductor regions, forms a first field effect switching transistor which constitutes said electronic switch (S1).

4. The integrated circuit according to claim 1 or 2, wherein said time-delay circuit (24) is composed of a RC element and including means for connecting said RC element first, to a terminal (14) charged with the supply voltage ($V_{DD}$) and, second, to ground potential ($V_{SS}$).

5. The integrated circuit according to claim 4, wherein said RC element comprises a load element (27) and a capacitor (T3), said load element being composed of a third field effect transistor whose gate is connected to its drain terminal, and said capacitor (T3) being composed of a fourth field effect transistor whose source and drain terminals are connected to on another to form a first capacitor terminal, said gate terminal of said forth field effect transistor constituting the second capacitor terminal.

6. The integrated circuit according to claim 1 or 2, wherein the output (25) of the time-delay circuit (24) is connected to an inverting amplifier (26) which contains a series circuit of a fifth and a sixth field effect transistor (T4, T5) of different channel types and whose gates are connected to the output (25) of the time-delay circuit (24); and said series circuit is connected, first, to the supply voltage VDD) via a further load element and, second, to the output (17) of the substrate bias generator (16).

7. The integrated circuit according to claim 1 or 2, including a dynamic semiconductor memory having high integration density, said integrated circuit being connected to said memory as an input/output circuit.

* * * * *